United States Patent [19]

Janutka

[11] Patent Number: 4,492,883
[45] Date of Patent: Jan. 8, 1985

[54] UNPOWERED FAST GATE TURN-OFF FET

[75] Inventor: William J. Janutka, West Allis, Wis.

[73] Assignee: Eaton Corporation, Cleveland, Ohio

[21] Appl. No.: 390,720

[22] Filed: Jun. 21, 1982

[51] Int. Cl.³ .................... H03K 17/04; H03K 17/687
[52] U.S. Cl. .................................... 307/571; 307/246; 307/572; 307/581
[58] Field of Search ............... 307/499, 501, 360, 246, 307/570–572, 577, 579, 581, 584, 270, 318, 252 A, 252 C, 252 P, 300; 357/23 GP

[56] References Cited

U.S. PATENT DOCUMENTS

| | | | |
|---|---|---|---|
| 3,819,952 | 6/1974 | Enomoto et al. | 357/23 GP |
| 3,896,367 | 7/1975 | Frantz | 307/570 X |
| 4,020,365 | 4/1977 | Weir | 307/571 |
| 4,266,149 | 5/1981 | Yoshida | 307/270 X |

Primary Examiner—Stanley D. Miller
Assistant Examiner—David R. Hudspeth
Attorney, Agent, or Firm—Andrus, Sceales, Starke & Sawall

[57] ABSTRACT

A fast turn-off MOSFET circuit is provided by a JFET in the gate circuit of the MOSFET which is connected to the same gate drive terminal as the MOSFET. The JFET becomes conductive upon turn-off of the MOSFET due to removal of gate drive. Conduction of the JFET provides faster discharge therethrough of residual stored charge on the MOSFET gate, whereby to facilitate faster MOSFET turn-off. A zener diode is connected in the gating circuitry and has a greater breakover voltage than the pinch-off voltage of the JFET, such that during turn-on, gate drive first pinches OFF the JFET and then charges up the MOSFET gate to drive the MOSFET into conduction.

11 Claims, 3 Drawing Figures

4,492,883

UNPOWERED FAST GATE TURN-OFF FET

TECHNICAL FIELD

The invention relates to enhancement mode field effect transistors (FETs), and more particularly to gating circuitry facilitating fast turn-off.

BACKGROUND AND SUMMARY

Enhancement mode field effect transistors, for example MOSFETs (metal oxide semiconductor field effect transistors), are well known in the art, including various gating techniques. An enhancement mode FET conducts current between its drain and source in response to gate drive. The FET may be turned OFF by simply removing the gate voltage. Because of the capacitance that exists between the gate, source and drain of the FET, any change in the gate voltage is achieved only through an attendant movement of charge to and from the FET gate region. The speed with which a FET can be turned ON and OFF is dependent upon the speed with which the charge can be stored in and removed from the gate capacitance. Some gating circuits are able to supply sufficient current to charge the gate rapidly to attain fast turn-on, but must rely on a resistance connected between the gate and source of the FET to remove the gate charge for turn-off. In order to achieve fast turn-off a low value resistance must be used requiring that a high current be maintained through the gate resistance while the FET is ON, all as is known.

The present invention provides fast turn-off but without a high current required from the gate driving source.

The FET turn-off circuitry of the present invention is unpowered and uses a depletion mode JFET (junction field effect transistor) to drain off or deplete the residual stored charge in the gate to source capacitance of a MOSFET, in the preferred embodiment, upon removal of gate drive. Conduction of the JFET enables faster discharge therethrough of the MOSFET gate, whereby to facilitate faster MOSFET turn-off. The JFET is connected between the MOSFET gate and source, and is connected to the same gate drive terminal as the MOSFET gate. The JFET is pinched OFF in response to gate drive to prevent draining of the gate drive away from the MOSFET gate and hence insure turn-on of the MOSFET.

DETAILED DESCRIPTION

Figure 1:
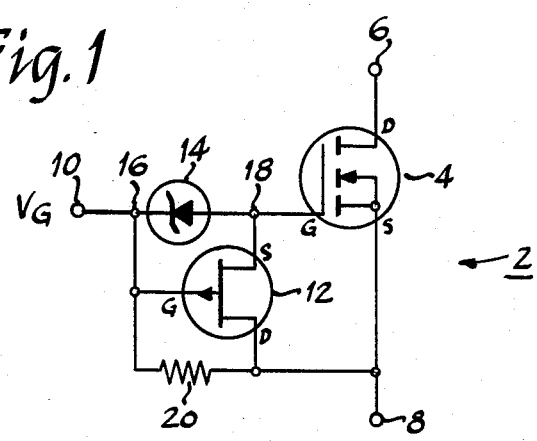
FIG. 1 is a circuit diagram of a fast turn-off FET circuit constructed in accordance with the invention.

In FIG. 1, fast turn-off FET circuit 2 includes a n channel enhancement mode MOSFET 4 having a drain connected to drain terminal 6 and a source connected to source terminal 8. Upon application of gate drive to a gate terminal 10, for example from a positive gating voltage source $V_G$, FET 4 is driven to its conductive ON state to conduct current from drain terminal 6 to source terminal 8 in a given circuit application (not shown).

A depletion mode p channel JFET 12 is connected to the gate of FET 4 and is conductive upon turn-off of FET 4 due to removal of gate drive from gate terminal 10. Conduction of JFET 12 provides faster discharge therethrough of residual stored charge on the gate of FET 4, whereby to facilitate faster turn-off of FET 4. JFET 12 is connected between the FET gate and the FET source at terminal 8. The gate of JFET 12 is connected to gate terminal 10 such that JFET is pinched OFF in response to gate drive to FET 4, to prevent draining of this gate drive away from the FET gate.

Voltage threshold means 14, such as a zener diode, is connected between gate terminal 10 and the FET gate, and has a greater breakover voltage than the pinch-off voltage of JFET 12. The JFET gate is connected to a point 16 between gate terminal 10 and zener diode 14, such that gate drive on terminal 10 first pinches off JFET 12 and then charges up the gate of FET 4 to drive FET 4 ON. The JFET source is connected to a point 18 between zener diode 14 and the FET gate, and the JFET drain is connected to the FET source at terminal 8. A resistor 20 is connected between the JFET gate and the FET source at terminal 8.

Figure 2:
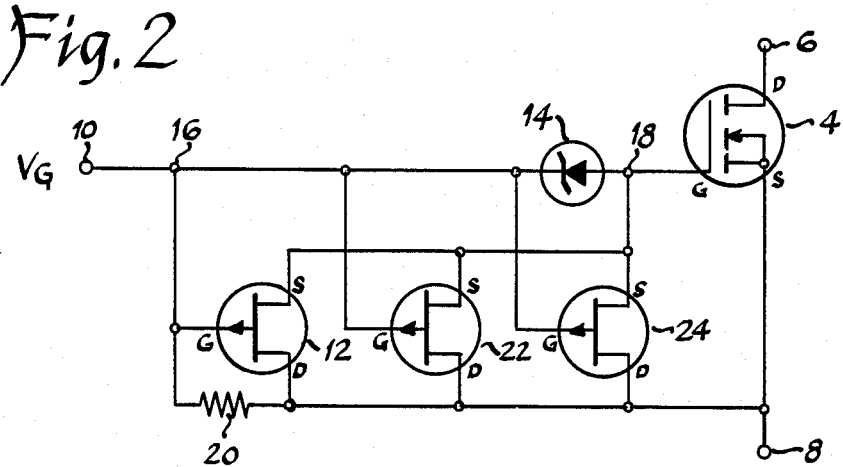
FIG. 2 is a circuit diagram showing an alternate embodiment of the circuit of FIG. 1.

FIG. 2 shows a modification of the circuit of FIG. 1, and like reference numerals are used where appropriate to facilitate clarity. The circuit of FIG. 2 provides greater current sinking capability by paralleling a plurality of JFETs, such as JFETs 12, 22 and 24. In response to gate drive on terminal 10, each of the JFETs is pinched OFF due to their base connection to a point between terminal 10 and zener diode 14, and FET 4 is turned ON. Upon removal of gate drive from terminal 10, JFETs 12, 22 and 24 assume their normally conducting ON state, affording fast discharge therethrough of the residual stored charge in the gate to source capacitance of FET 4.

Figure 3:
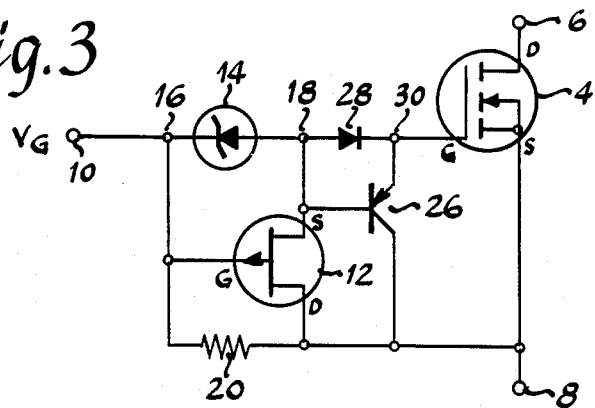
FIG. 3 is a circuit diagram showing another alternate embodiment of the circuit of FIG. 1.

FIG. 3 shows a further modification of the circuit of FIG. 1, and like reference numerals are used where appropriate to facilitate clarity. Bipolar transistor means, such as a PNP transistor 26 is connected to the FET gate and driven into conduction by residual stored charge in the gate to source capacitance of FET 4 upon turn-off of the latter due to removal of gate drive. Conduction of transistor 26 provides additional discharge therethrough of the FET gate, whereby to facilitate yet faster FET turn-off. A diode 28 is connected between point 18 and the FET gate. The emitter of bipolar transistor 26 is connected to a point 30 between diode 28 and the FET gate. The collector of transistor 26 is connected to the FET source at terminal 8. The base of transistor 26 is connected to point 18 and to the source of JFET 12.

In response to gate drive, diode 28 is forward biased and the emitter base junction of transistor 26 is reverse biased, such that bipolar transistor 26 is biased OFF to prevent draining of gate drive away from the FET gate. The forward biased diode 28 passes gate drive therethrough to drive FET 4 into conduction. Upon removal of gate drive at terminal 10, diode 28 becomes reverse biased due to gate to source capacitance of FET 4, whereby to block current flow through diode 28 from the FET gate to the base of transistor 26. This insures forward biasing of the emitter base junction of transistor 26 to thus turn transistor 26 ON. The biasing of transistor 26 into conduction is aided by the conduction of JFET 12 upon removal of gate drive from terminal 10.

It is recognized that various modifications and alternatives are possible within the scope of the appended claims.

I claim:

1. A fast turn-off FET circuit having drain, source and gate terminals, comprising:
    an enhancement mode FET having a drain connected to said drain terminal, a source connected to said source terminal and a gate operatively coupled to said gate terminal;
    a depletion mode JFET having a normally conductive ON state and connected to said FET gate and source and conductive upon turn-off of the latter due to removal of gate drive, conduction of said JFET providing faster discharge therethrough of residual stored charge on said FET gate, whereby to facilitate faster FET turn-off;
    threshold voltage breakdown means connected between said gate terminal and said FET gate and having a greater breakover voltage than the pinch-off voltage of said JFET.

2. The invention according to claim 1 wherein said gate terminal is coupled to said FET gate for carrying said gate drive, said JFET has its drain-source current path connected between said FET gate and said FET source, said JFET having a gate connected to said gate terminal such that said JFET is pinched off in response to gate drive to said FET, to prevent draining of said gate drive away from said FET gate.

3. The invention according to claim 2 wherein said gate of said JFET is connected to a node connecting said gate terminal and said threshold voltage breakdown means, such that said gate drive on said gate terminal first pinches off said JFET and then charges up said FET gate to drive said FET ON.

4. The invention according to claim 3 wherein said threshold voltage breakdown means comprises a zener diode, and said JFET is of p channel type and has its source connected to a node connecting said zener diode and said FET gate and has its drain connected to said FET soruce.

5. The invention according to claim 4 comprising resistance means connected between said JFET gate and said FET source.

6. The invention according to claim 3 comprising a plurality of JFETs connected in parallel between said FET gate and said FET source, each JFET connected to a node connecting said gate terminal and said threshold voltage breakdown means.

7. The invention according to claim 3 comprising bipolar transistor means connected to said FET gate and driven into conduction by residual stored charge in the gate to source capacitance of said FET upon turn-off of the latter due to removal of gate drive, such that conduction of said bipolar transistor means provides additional discharge therethrough of said FET gate, whereby to facilitate faster FET turn-off.

8. The invention according to claim 7 wherein said bipolar transistor means is connected between said FET gate and said FET source, and is biased OFF in response to gate drive to said FET to prevent draining of said gate drive away from said FET gate.

9. The invention according to claim 8 comprising a diode connected between said threshold voltage breakdown means and said FET gate, said bipolar transistor means having a base connected to said JFET and to a node connecting said threshold voltage breakdown means and said diode, said bipolar transistor means having one end of its collector-emitter current path connected to a node connecting said diode and said FET gate and having another end of its collector-emitter current path connected to said FET source, said diode being forward biased in response to gate drive to pass gate drive therethrough to drive said FET gate, said diode being reverse biased in response to gate to source capacitance of said FET upon removal of gate drive whereby to block current therethrough between said FET gate and said base of said bipolar transistor means and insure biasing of said bipolar transistor means into conduction, said last mentioned biasing being aided by conduction of said JFET upon removal of said gate drive.

10. A fast turn-off FET circuit having drain, source and gate terminals, comprising:
    an enhancement mode n channel FET having a drain connected to said drain terminal, a source connected to said source terminal, and a gate operatively coupled to said gate terminal;
    a zener diode having its anode connected to said FET gate and its cathode connected to said gate terminal;
    a p channel depletion mode JFET having a normally conductive ON state and having its source connected to a node connecting said zener diode and said FET gate, its gate connected to a node connecting said gate terminal and said zener diode, and its drain connected to said FET source, the breakover voltage of said zener diode being greater than the pinch-off voltage of said JFET.

11. The invention according to claim 10 further comprising:
    a diode having its anode connected to said node connecting said zener diode anode and said JFET source, said diode having a cathode connected to said FET gate; and
    a bipolar PNP transistor having an emitter connected to a node connecting said diode and said FET gate, a base connected to said node connecting said JFET source and said anodes of said zener diode and said second mentioned diode, and having a collector connected to said FET source.

* * * * *